United States Patent [19]

Solomon et al.

[11] Patent Number: 5,305,326

[45] Date of Patent: Apr. 19, 1994

[54] HIGH AVAILABILITY DISK ARRAYS

[75] Inventors: Robert C. Solomon, Kensington, N.H.; Stephen J. Todd, Shrewsbury, Mass.

[73] Assignee: Data General Corporation, Westboro, Mass.

[21] Appl. No.: 847,639

[22] Filed: Mar. 6, 1992

[51] Int. Cl.$^5$ .................. G06F 11/10; H03M 13/00
[52] U.S. Cl. .................. 371/11.1; 371/51.1
[58] Field of Search .................. 371/11.1, 35, 38.1, 371/49.1, 50.1, 51.1, 40.1

[56] References Cited

U.S. PATENT DOCUMENTS

| | | | |
|---|---|---|---|
| 4,092,732 | 5/1978 | Ouchi | 364/900 |
| 4,761,785 | 8/1988 | Clark et al. | 371/51 |
| 5,072,378 | 12/1991 | Manka | 395/575 |
| 5,101,492 | 3/1992 | Schultz et al. | 395/575 |
| 5,148,432 | 9/1992 | Gordon et al. | 371/10.1 |

OTHER PUBLICATIONS

Patterson et al., "A case for Redundant Arrays of Inexpensive Disks (RAID)" University of California, Berkely, CA, undated.

NCR Disk Array Controller—Applications Notes, No. 5, Dec. 16, 1991.

*Primary Examiner*—Charles E. Atkinson
*Assistant Examiner*—Trinh Tu
*Attorney, Agent, or Firm*—Sewall P. Bronstein; Robert F. O'Connell

[57] ABSTRACT

A method for handling data in a plurality of data storage disks having user data sectors and corresponding parity sectors, the method being used when the disks are being operated in a degraded mode wherein data in sectors of an inoperative user data disk are reconstructed from data in the corresponding sectors of the other user data disks and the corresponding parity entry. The reconstructed user data in a user data sector of the inoperative disk is written into the corresponding parity sector in place of the parity entry therein, before any new data is written into the corresponding sector of an operative disk. Information identifying the inoperative disk is written into a specified identification region of the parity disk to indicate that such operation has occurred. The new data is then written into the corresponding sector of the operative disk.

2 Claims, 7 Drawing Sheets

HIGH AVAILABILITY DISK ARRAYS

INTRODUCTION

This invention relates to high availability disk arrays for use in data processing systems and, more particularly, to improved techniques for handling various types of power failure conditions that may occur during operation of the system.

BACKGROUND OF THE INVENTION

A particular disk array system which provides a high degree of availability of the disks thereof has recently been developed, which system is often referred to as a Redundant Array of Inexpensive Disks (RAID). A specific implementation thereof is often referred as a Level 5 array, i.e., a RAID-5 disk array, which implementation is described in the article, "A Case For Redundant Arrays of Inexpensive Disks (RAID), David A. Patterson et al., Dept. of Electrical Engineering and Computer Sciences, University of California, Berkeley, Calif. Such system uses an intelligent input/output (I/O) processor for accessing one or more disk modules of the array in response to the needs of a host computer, each disk module of the array being driven by disk drive circuitry operating via the I/O control processor in a manner that effectively appears to the host computer as a single disk drive. A disk module comprises, for example, a disk, disk driver circuitry, and power/control circuitry. Alternatively, in some implementations of such systems, an I/O processor need not be used and the host computer may communicate directly with the disk modules which form an array.

In a particular RAID-5 context, for example, which comprises an array of five disk modules, each disk has a plurality of "N" data storage sectors, corresponding sectors in each of the five disks being usually referred to as a "stripe" of sectors. With respect to any stripe, 80% of the sector regions in the stripe (i.e., in a 5 disk array effectively 4 out of 5 sectors) is used for user data and 20% thereof (i.e., effectively 1 out of 5 sectors) is used for redundant, or parity, data. The use of such redundancy allows for the reconstruction of user data in the event of a failure of a user data sector in the stripe.

When a user data disk module fails, the redundant or parity entry that is available in the parity sector of a stripe and the data in the non-failed user data sectors of the stripe can be used to permit the user data that was in the sector of the failed disk to be effectively reconstructed so that the system can remain operative using such reconstructed data even when the user data of that sector of the failed disk cannot be accessed. The system is then said to be operating in a "degraded" mode since extra processing operations and, accordingly, extra time is required to reconstruct the data in the failed disk sector when access thereto is required.

Certain kinds of failures, however, can occur in which the array is left in an incoherent or effectively unusable state, e.g., a situation can occur in which there is power failure, i.e., power to the I/O processor (IOP) fails or the I/O processor itself fails due to a hardware defect, or power to the disk drives themselves fails. A further problem can arise, for example, if a power failure results in the need to use a new IOP to replace a failed one and there is no way to identify where a write operation to a sector of the array was taking place after the new IOP has replaced the old IOP.

It is desirable to devise techniques for handling such power failure situations that cannot be handled by RAID-5 systems as currently designed and used.

DESCRIPTION OF THE INVENTION

The invention can be described in more detail with the help of the accompanying drawings wherein FIGS. 1–5 show diagrammatic views of sectors of a stripe in a group of disk modules for various exemplary data/parity situations;

Figure 6:
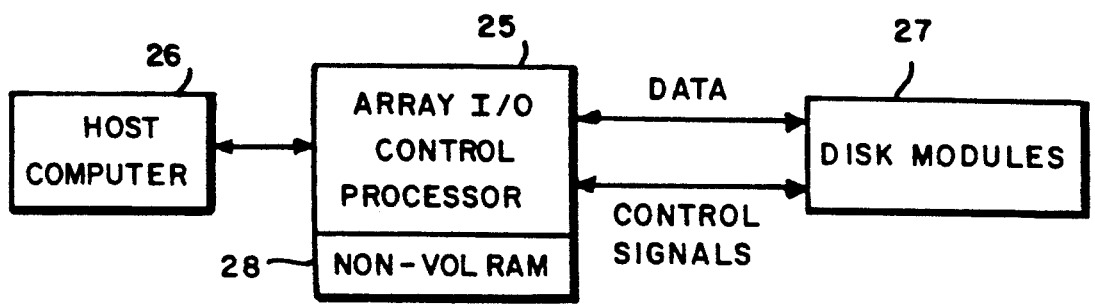
FIG. 6 shows a block diagram of a disk module system of the invention.

FIG. 6 depicts a block diagram of a system in which the invention can be embodied. As seen therein, an array I/O control processor 25 communicates with a host computer and with a plurality of disk modules 27. The I/O control processor 25 includes a non-volatile random-access-memory (RAM) as discussed in more detail below. The control processor controls the write/read operations of the disk modules as well as the operations for opening up an array of disk modules for use in the system and for reconstructing data in a failed disk of the system, as discussed in more detail below. A system may utilize a single I/O processor for controlling an overall multiple array sub-system, or each disk array may have its own corresponding processor associated with it.

Figure 1:
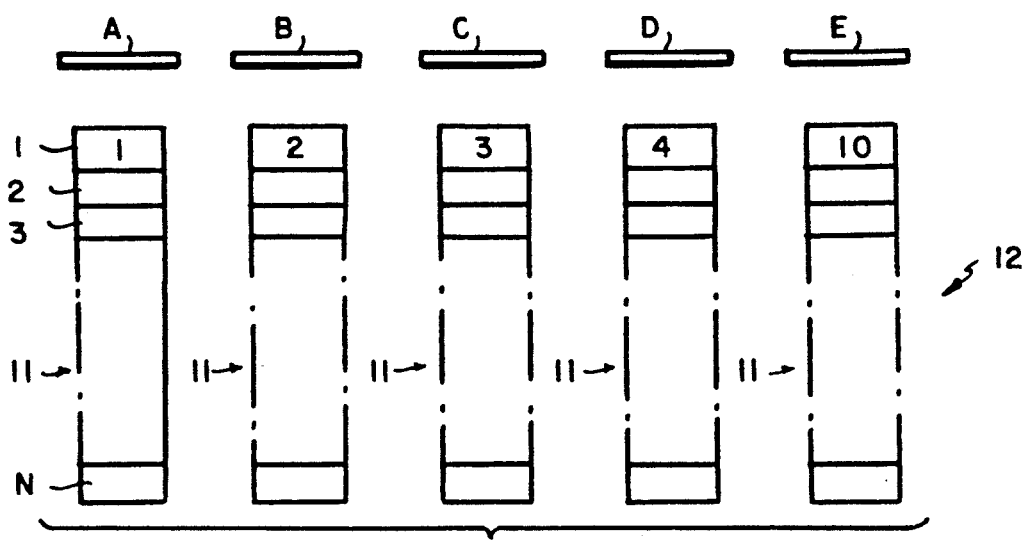

The invention can be better understood by reviewing briefly the concept of a basic RAID system and the use therein of a redundant, or parity, operation, as discussed with reference to FIG. 1. For simplicity in understanding such concept, rather than using complicated digital encoding to describe data stored in the disks of an array, the following discussion represents such data merely by integers, it being realized that such integers are in reality digitally encoded words. The array in FIG. 1, for example, represents a array 10 comprising five disks, the disks being represented by disk units A, B, C, D and E, each having a plurality disk storage sectors 11 used to store data in each disk, exemplary sectors 1, 2, 3, ... N on each disk being specifically shown diagrammatically in FIG. 1. Corresponding groups of sectors 1 through N on each disk of the five disks, as shown in FIG. 1, represent a stripe 12 of the five disk array depicted. Other corresponding groups of sectors on each disk (not shown) of the type shown in FIG. 1 can represent other stripes of the five disk array.

The disk array, as shown in FIG. 1, may be part of a much larger overall multiple array sub-system which includes other disk arrays. For example, a typical multiple array sub-system may utilize six arrays, each being of the type having five disks as shown in FIG. 1, thereby providing a 30-disk multiple array sub-system, the entire sub-system being appropriately connected to one or more I/O processors for providing access to each of the disks of the multiple array via suitable multiple buses (e.g., via well-known "Small Computer System Interface," or "SCSI," buses), as well as other control buses, as would be known to the art. For simplicity in understanding the invention, a description thereof with reference only to a single stripe of a single array, as in FIG. 1, is provided, it being understood that the same operation occurs with reference to each of the other stripes of the array.

In stripe 12 of FIG. 1, with reference to sector 1 of each of disks A, B, C, D and E, if it is assumed that user data in sector 1 of disks A, B, C and D is represented by integers 1, 2, 3 and 4, respectively, the entry in corresponding sector 1 of disk E (used as the "parity" disk for that stripe) is the sum of the data in the user data sectors, i.e., $1+2+3+4=10$. Data in any one of the sectors, e.g., a sector of a disk that has failed, can be reconstructed by subtracting the data in the other corresponding non-failed sectors of non-failed disks from the parity entry in the parity sector. Thus, assuming a failed disk C, if it is desired to reconstruct the data "3" in sector 1 of failed disk C, for example, such reconstruction can accordingly be made by such subtraction process, e.g., $10-1-2-4=3$.

Figure 2:
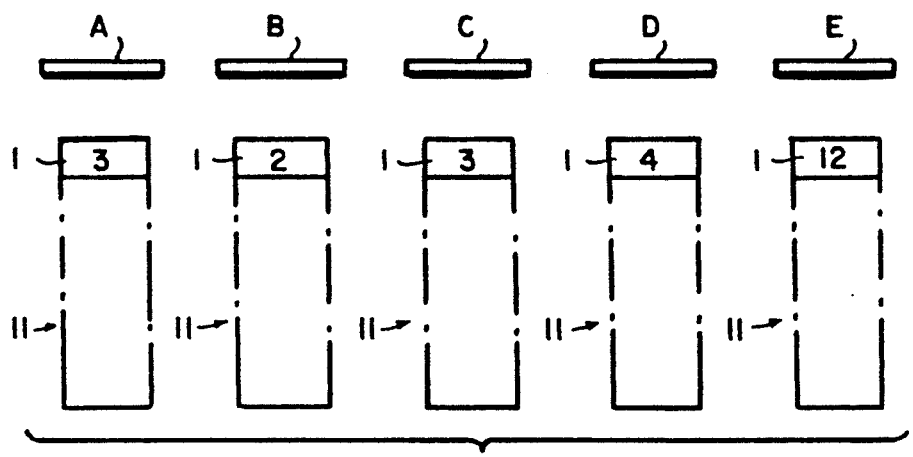

A problem can arise if a power failure described above occurs, e.g., a power failure to the IOP, a hardware failure in the IOP, or a power failure to the disks, after new data has been written into a particular sector of a particular disk, but before the new parity entry can be written into the parity sector. For example, as described with reference to FIG. 2, if new data 3 is written into sector 1 of disk A, a new parity entry should be entered in disk E, namely $3+2+3+4=12$. Such new parity data is normally written as follows. The old data (e.g. "1") in sector 1 of disk A is read and the difference between the new data and the old data in sector 1 of disk A is determined, i.e., $3-1=2$. The new data "3" is then written into sector 1 of disk A. The old parity 10 in sector 1 of disk E is read and is added to the above-determined difference data "2" to obtain a new parity entry "12" which is then written into the parity sector 1 of disk E.

Alternatively, parity can be determined and the parity entered first in the parity disk before the new data is written into the user data disk, or, as a further alternative, the new data and the new parity can be entered substantially simultaneously.

Figure 3:
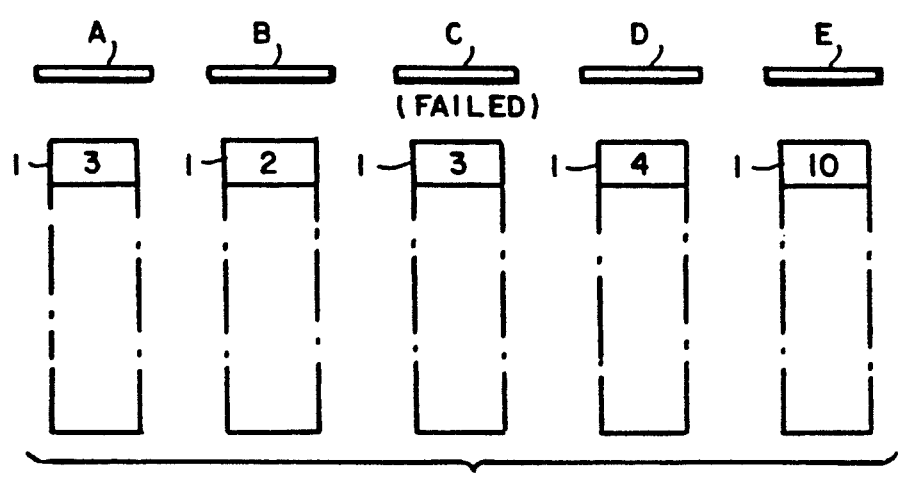

However, if a failure as mentioned above occurs before the new parity entry "12" is written into sector 1 of disk E but after the new data "3" is written into sector 1 of disk A, the data in the sectors 1 of the disks will be as shown in FIG. 3 wherein the old parity 10 remains in sector 1 of disk E while new data 3 is in sector 1 of disk A. Under such conditions, if an attempt is made to reconstruct the data in a failed disk C of the stripe, the reconstructed data will be incorrect (i.e., the reconstructed data $(10-3-2-4)$ will be "1" rather than the correct data "3".

In order to avoid an incorrect reconstruction of data on the failed disk, a non-volatile RAM 28, shown in FIG. 6, is used in the I/O control processor. In accordance with the invention, each time new data is to be written into a sector of a particular disk, the I/O processor stores the following information, concerning the location where the new data is to be written, into the non-volatile RAM (NV-RAM).

1. The particular array of a multiple array system into which the new data is to be written.
2. The particular starting sector in the array in which the new data is to be written. For example, sector 1 of disk A.
3. The number of sectors which are being written into. For example, the data may be written into only one sector.

If multiple I/O processors are used, each processor being associated with a different array of disk modules, each I/O processor will normally use its non-volatile RAM to store information only with respect to its own array.

Where an array is powered up after a failure has occurred and the array has recovered therefrom, before using the data in the array depicted in FIG. 1, the IOP must make sure that there is no discrepancy between the user data in corresponding sectors in each of the disks A, B, C and D of the array and the parity entry in the corresponding parity sector on disk E. That is, the system must determine that the parity correctly matches the current user data in the other corresponding user data sectors. In order to make such determination, the I/O processor scans the NV-RAM to determine where write operations were in progress when the power failure occurred, e.g., the IOP identifies the array, the starting sectors and the number of sectors thereof where write operations were in progress. Then, depending on the data which is currently in the sectors where a write was in progress, the corresponding parity sectors are determined. Thus, if a write was in progress in sector 1 of disk A and the user data in sector 1 of disk A is still the old data "1", the parity is determined as $1+2+3+4=10$. However, if the user data in sector 1 of disk A has been changed to new data 3, the parity is determined as $3+2+3+4=12$. However, if the actual parity in sector 1 of disk E is still "10" the IOP knows that a mismatch exists. The IOP then changes the parity entry in parity sector 1 of disk E to "12" so that it now matches the actual user data in the user data sectors 1 of disk A, B, C and D.

Accordingly, because the write-in-progress location has been correctly identified in the NV-RAM, the parity and the user data of corresponding sectors can always be so matched so that it can be assured that the reconstructed data in a sector of a failed disk will always be consistent with the data that is actually present in the corresponding sectors of the other non-failed disks and with the parity entry in the corresponding parity sector. By such operation, since there will always be a match between the actual user data and the parity in corresponding sectors of a stripe, the I/O processor can be assured, when such match is checked, that data that is reconstructed from the user sector data and parity entry of the non-failed disks correctly represent the data of the failed disk.

In another situation where a new I/O control processor is put into place in the system, that is, either an old I/O control processor is defective or, for some other reason, an old I/O control processor has had to be replaced, or, in a multiple I/O processor system, one of the I/O processors servicing another disk array is requested to service the array previously serviced by the failed processor, the new control processor no longer has the above desired information in its NV-RAM (such NV-RAM is effectively blank) so that it is not possible to bring about a matching of the user data and parity in all of the sectors of the array in which data has been changed since it is not possible to locate where a new write operation was in progress when failure occurred. In such a situation, a further technique of the invention, referred to herein as a "background/verify" operation, is used.

In accordance with such background/verify operation, the host computer continues to perform whatever operations with which it is involved, while the new I/O control processor, when it is not required for such operations, successively reads user data and the corresponding parity in each sector of each disk of the array. In doing so, the new I/O control processor checks each parity entry in each sector and matches the parity entry in each parity sector to whatever user data is actually present in each of the corresponding user sectors. If, during such parity verification process, the new control processor finds that a parity mismatch exists, it corrects the parity entry by using the user data actually found in each corresponding user data sector, even though the control processor is unable to determine what caused the mismatch, i.e., whether the user data in one or more of the user sectors is incorrect or whether the parity entry in the corresponding parity sector is incorrect. The verification obtained by performing such user data/parity matching operation for corresponding sectors is made in between other operations which must be performed by the I/O control processor under command of the host computer (i.e., in the "background" with respect to such other operations), such verification operation by the I/O control processor being effectively invisible to the host computer. Thus, when the verification process is completed, there is an assurance that there are no inconsistencies between the user data stored in each sector and the parity entry in the corresponding parity sector associated with such user data.

A further problem may arise when a new I/O processor is used and there is a failed disk in an array being serviced by the IOP, so that the NV-RAM of the new IOP cannot be used to determine where invalid data may be located. When the host attempts to access a sector in the failed disk of the array, there is no way to determine that, when operating in a degraded mode, the reconstructed data in that sector of the failed disk has been correctly reconstructed. In such a situation a technique that has been suggested to be used is often referred to as a "version number" technique.

Figure 4:
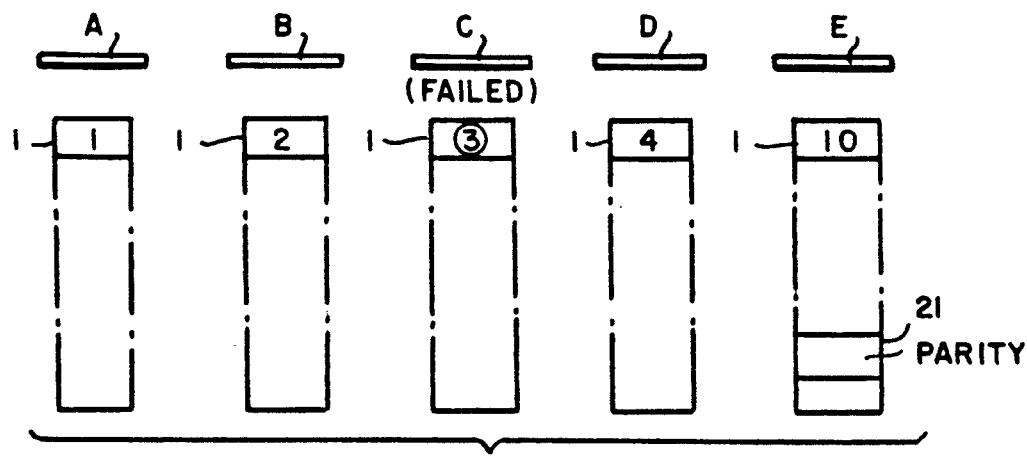

Such a technique is described in U.S. Pat. No. 4,761,785 issued on Apr. 2, 1988 to Clark et al. In such a process, as shown in FIG. 4 of the patent, regions 418, 420, 422 and 424 corresponding to the user data storage sectors of each disk in an array are used. A version number is written into such region, which number is initially a zero. Further, the version numbers 428, 430, 432 and 434 are used in the "parity" disk to provide a record therein of each version number in the associated data disk. When new data is written into a sector, e.g., new data is written into a sector of disk 410, the version number therein is incremented and the parity sector reflects that change by incrementing its corresponding version number. If there is a failed disk and the array is operating in a degraded mode, and a power failure occurs after new data is written into a non-failed sector but before the corresponding version number is incremented in the parity disk sector, when the host tries to access this particular sector using a new I/O processor, there is no information in the NV-RAM of the new processor to identify where mismatches may exist. Accordingly, the version number can be used to identify where such mismatches exist.

When the host attempts an access to a sector of a failed disk, a check is made of the version numbers in the user data disks and in the corresponding parity disk. If the user data version numbers do not match the parity version number, the host, via the I/O processor, can determine that a mis-match situation has occurred. By using such version number mismatch operation the I/O processor knows that the data in the identified sector may be invalid. Accordingly, the host is not permitted to access the failed sector, although it is still permitted to access the data in other sectors in the array.

If, on the other hand, a version number match occurs, the I/O processor knows that the parity entry in a sector is correct with respect to the user data actually present in the non-failed user disk sectors, so that the IOP can correctly reconstruct the data in the corresponding sector of a failed disk. Thus, by using the version number technique, at worst only data in one or a few sectors of a failed disk cannot be accessed and would be lost to the host.

It would be helpful, however, to be able to avoid even losing the data in those few sectors in the above situation, i.e., when the array is operating in a degraded mode. The loss of such data can be avoided in accordance with the invention by using a further technique which can be referred to as a "parity shedding" process, which is described as follows.

Let it be assumed that a disk array is being operated in a degraded mode, i.e., there is a failed disk whose data must be reconstructed using the parity and the user data from the other non-failed data disks, as described above. Before writing new data into a sector of a non-failed disk, e.g., sector 1 of disk A of an array wherein disk C has failed, the reconstructed data of the failed disk (which reconstructed data is based on the old data in sector 1 of disk A, the correct data in sector 1 of disks B and D, and the correct parity entry in sector 1 of disk E) is written into the parity sector in place of the parity entry currently in such parity sector. Thus, as seen in the example of FIG. 4, data "1", "2" and "4" are in disks A, B and D and parity "10" is in disk E, so that, from such data and parity entry, when operating in a degraded mode, the data 3 (shown encircled) can be reconstructed in sector 1 of failed disk C. A specified identification region 21 of disk E has an entry therein which specifies that the entry in sector 1 is a "parity" entry, as shown in FIG. 4.

Figure 5:
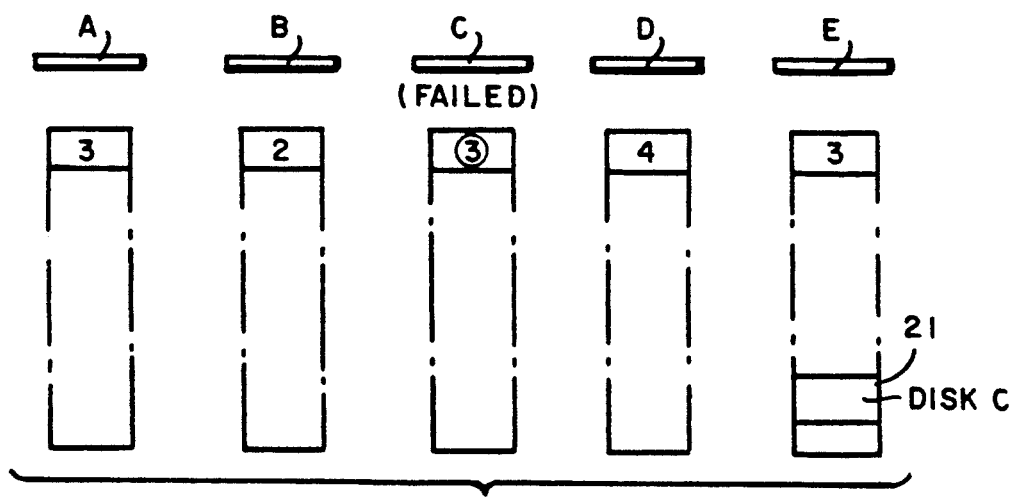

If it is desired to write new data "3" into sector 1 of disk A, in accordance with the "parity shedding" technique being described, before performing such write operation, the reconstructed data 3 in sector 1 of failed disk C is written into the parity sector 1 of disk E to replace the previous parity entry "10". therein, as shown in FIG. 5. At the same time the identity of the failed disk whose reconstructed data has been written into the parity sector of disk E is entered into specified identification region 21 of parity disk E, as also shown in FIG. 5, indicating that the previous parity entry has been replaced by reconstructed data of the identified disk.

When the new data "3" is then written into sector 1 of disk A, as shown in FIG. 5, if the IOP desires to read the reconstructed data in sector 1 of failed disk C (which data can't be read from the failed disk itself), the I/O control processor examines the entry in parity sector 1 of disk E and the information in the identification region 21 of parity disk E to see if such reconstructed data has been written in sector 1 of disk E in place of the original parity entry. If it has, then the I/O processor can safely access the data directly from the parity sector 1 of disk E and be assured that it is the correctly reconstructed data of sector 1 of failed disk C.

Specific implementations of read and write operations which can make use of the non-volatile RAM of the invention, the background/verify technique of the invention, the version numbers, and the parity shedding technique of the invention are discussed with reference to the flow charts of FIGS. 7-11. Specific programs can be readily created for use by the IOP from such flow charts by those of skill in the art using what is disclosed therein. Such specific programs can be devised for use in any particular I/O processor or host computer system and the creation thereof would be well within the skill of the art from a knowledge of what is disclosed in FIGS. 7-11.

Figure 7:
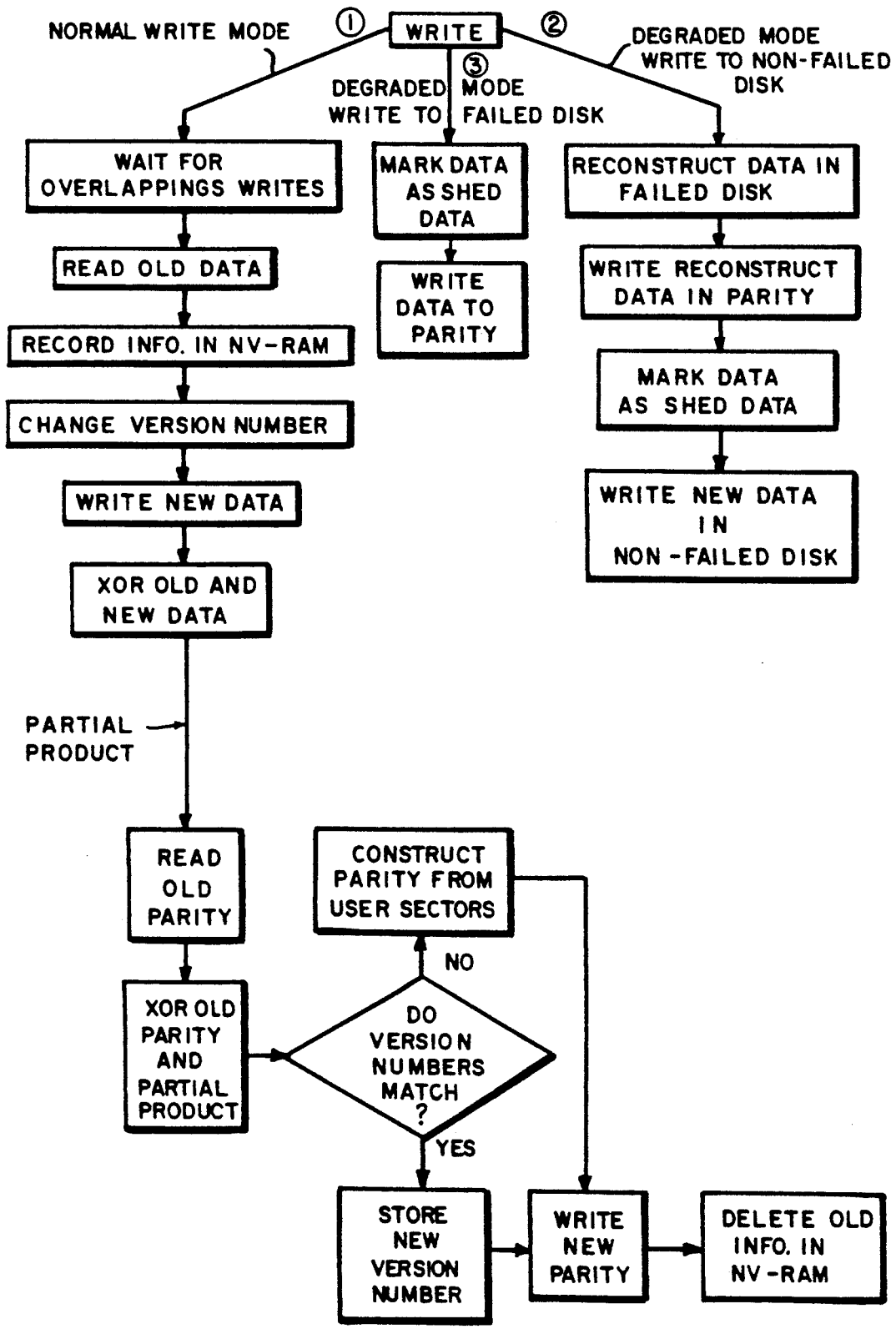
FIG. 7 shows a flow chart for various data write situations.

As can be seen in FIG. 7, for example, a write operation into a sector of an array can occur under three different conditions: first, under normal conditions wherein no disk failure and no power failure has occurred and all disks, as well as the I/O processor, are operating correctly; secondly, under a degraded mode condition wherein there is a single failed disk of an array and the write operation is directed to a non-failed disk, the data in the failed disk being capable of being reconstructed using the user data and parity entries in the non-failed disks; and thirdly, wherein, in a degraded mode, a disk into which a write is to be made is a non-operating, or failed, disk.

As can be seen in FIG. 7, in a normal write mode the IOP waits for overlapping write operations (i.e., other write operations which are concurrently being performed on the same sectors but which are not yet completed) to be completed. Once such concurrent write operations finish, the IOP reads the data currently in the sectors where the new data is to be written (the "old" data) and appropriately records the desired information, as discussed above with respect thereto in the NV-RAM, i.e., information identifying, for such write operation, the array, the starting sector, and the total number of sectors where write operations are to be performed.

The IOP then changes the appropriate version numbers associated with the disk in which a write is to be made. For example, a version number may be a two-state number (e.g., a "0" state or a "1" state) and each time a write is to occur the corresponding version number is toggled from its current state to its other state.

For each sector the new data is then written into the desired sector and the old data and new data are XOR'ed to create a partial product. The old parity is read and is then XOR'ed with the partial product. The version number is checked to determine if the version number in the parity sector matches the old version number of the written sector. If a match occurs, the new version number is stored into the version number region of the parity sector. The new parity entry is then written into the parity sector and the information in the NV-RAM with respect to the old data is deleted. If a match does not occur, parity is constructed from the user sectors and the newly constructed parity is written in the parity sector and the non-volatile RAM is deleted.

For a write operation to a non-failed disk in a degraded mode, the data in the sector of a failed disk is reconstructed from the parity entry sector and the data in the non-failed sectors. The reconstructed data is then written into the parity sector to replace the parity entry therein (a "parity shedding" operation) and such data is marked as shed data. The new data is written into the desired sector of the non-failed disk.

In writing to a failed disk in a degraded mode, the data to be written is identified as data which is to replace the parity entry of the parity sector and the data is written directly into the parity sector, to replace the parity entry therein, i.e., a direct parity shedding operation.

Figure 8:
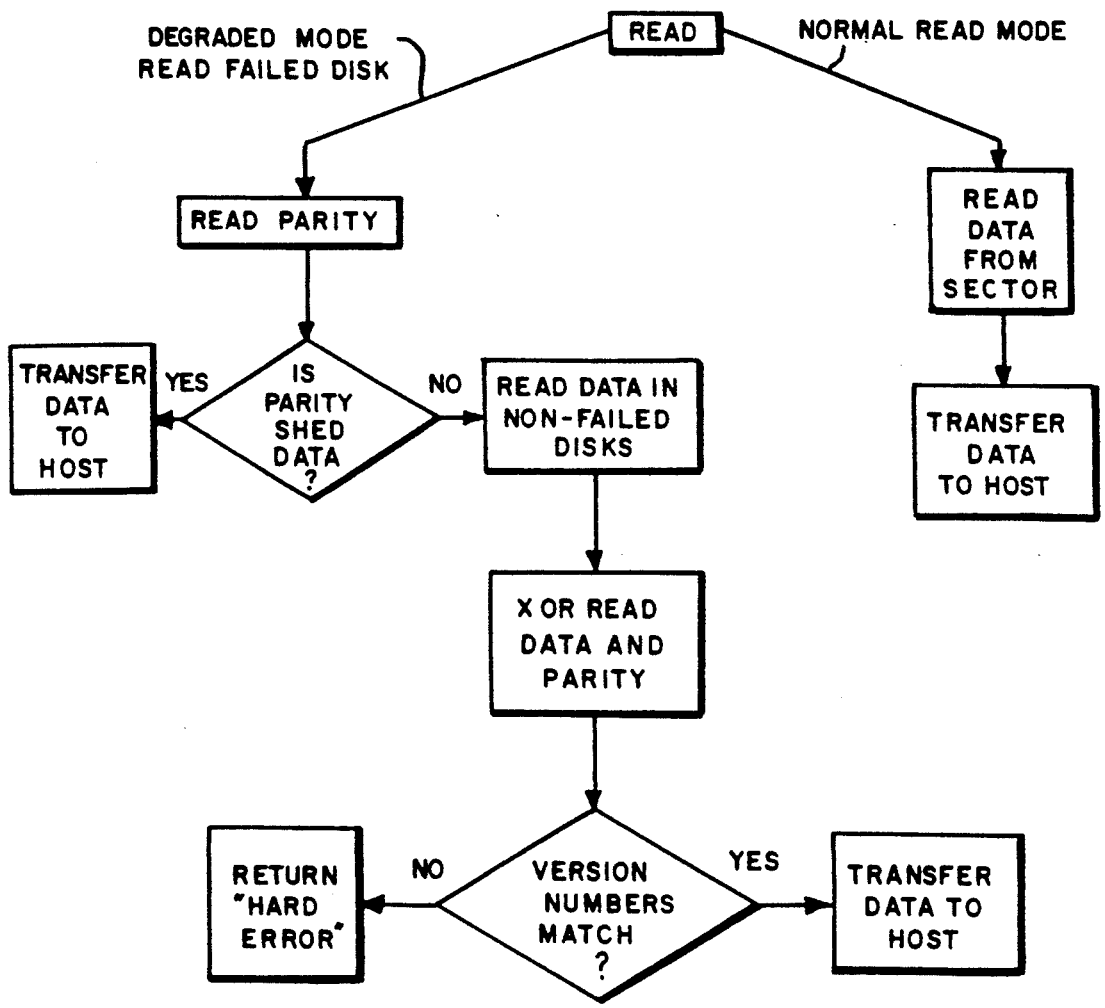
FIG. 8 shows a flow chart for various data read situations.

As shown in FIG. 8, when data is to be read, it is read either from a non-failed disk in a normal, non-degraded mode or in a degraded mode in which there is a failed disk, where the read is to be from the failed disk. In the normal mode the IOP reads the data directly from the desired sector and transfers such data to the host.

In reading from a failed disk in a degraded mode, the entry in the parity sector of the stripe is read and a check is made to see if such entry therein is a parity entry or is "shed data", i.e., data which has replaced the parity entry. If the data is shed data, it is read directly from the parity sector and transferred to the host. If it is not shed data, the data in the other non-failed disks are read. The parity entry is XOR'ed with such other data and a version number check is made (i.e., do the version numbers in the parity disk match the version numbers in the non-failed disks). If the version numbers match, the data can be reconstructed from the XOR'ed parity and other data and transferred to the host. If the version numbers do not match, an indication is provided to the host that a "hard" error mode has been encountered and the desired data cannot be validly read for transfers to the host.

Figure 9:
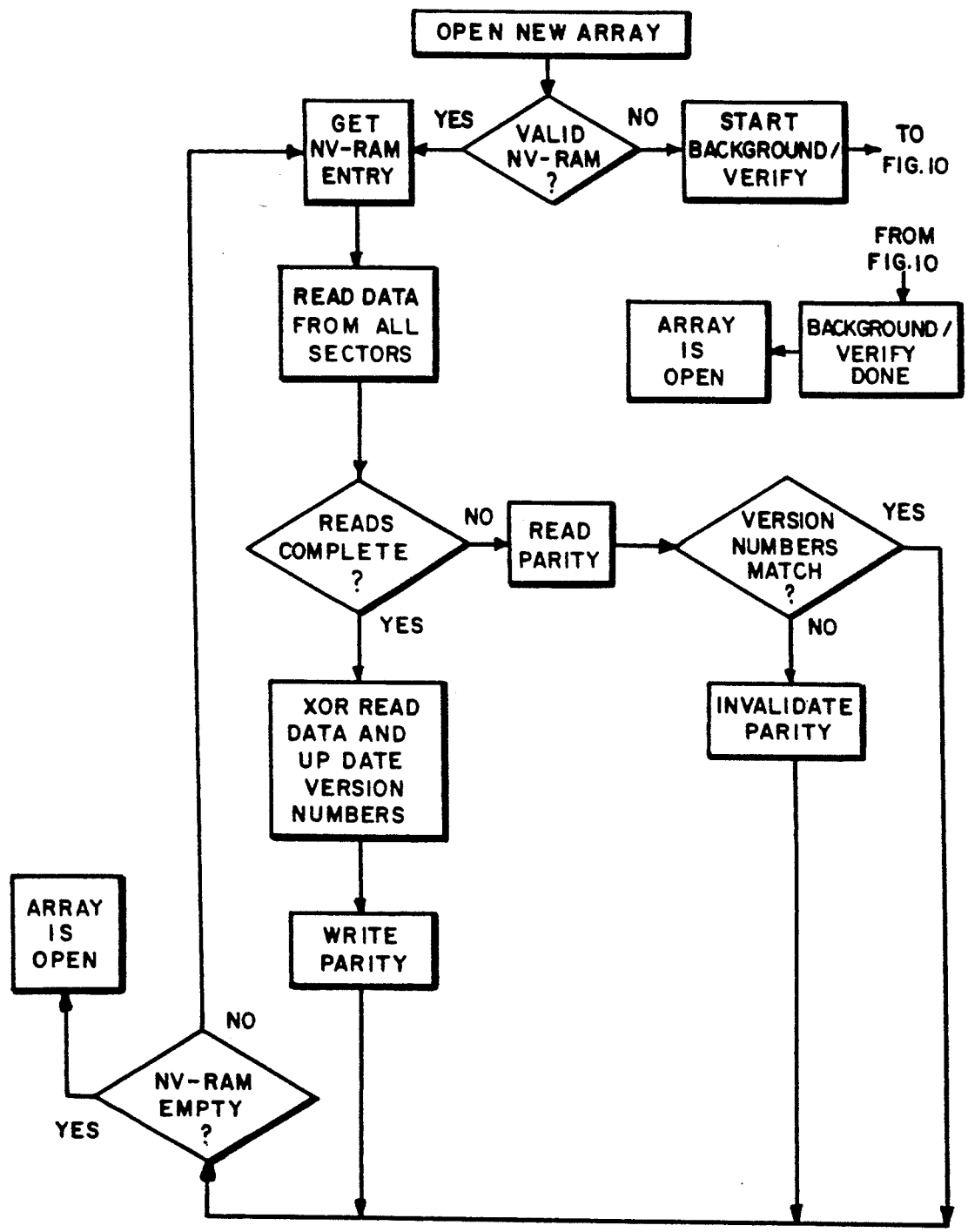
FIG. 9 shows a flow chart for opening an array of disk modules.

FIG. 9 depicts an operation which is performed when a new array of disks, not previously accessed by the system, is to be accessed by the IOP, or an array has been temporarily not available for access but becomes available therefor, often referred to as "opening" an array. As mentioned above, an IOP utilizes a non-volatile RAM for recording stripe and sector identification information with respect to an array. Each array may have entries in the NV-RAM in the IOP and, when opening an array, it must first be determined whether or not there are already entries in the NV-RAM in the IOP for the particular array being opened.

If no valid NV-RAM currently exists in the IOP for the array being opened, a background/verify process (see FIG. 10) is initiated by the IOP and the array is opened. If a valid NV-RAM is already available in the IOP, the NV-RAM entries for a particular array are obtained and the data from all the user data sectors for that entry are read. When the reads are completed the read data are XOR'ed together to form a parity entry and a new version number is provided therefor. The parity entry is written into the parity sector and the NV-RAM entry is deleted. Once all NV-RAM entries for this array have been deleted, the array is open.

If, however, the reads cannot be completed because the array is in a degraded mode (a sector cannot be read directly on a disk), the parity entry for that array is read and a determination is made as to whether the version numbers in the parity disk match the version numbers in the data disks. If they do not, the parity entry is invalidated and nothing further can be done with that NV-RAM entry and the NV-RAM entry is deleted, and the process is repeated for the next NV-RAM entry (if there is one). If the version numbers match, the NV-RAM entry is deleted but the parity is not invalidated.

Figure 10:
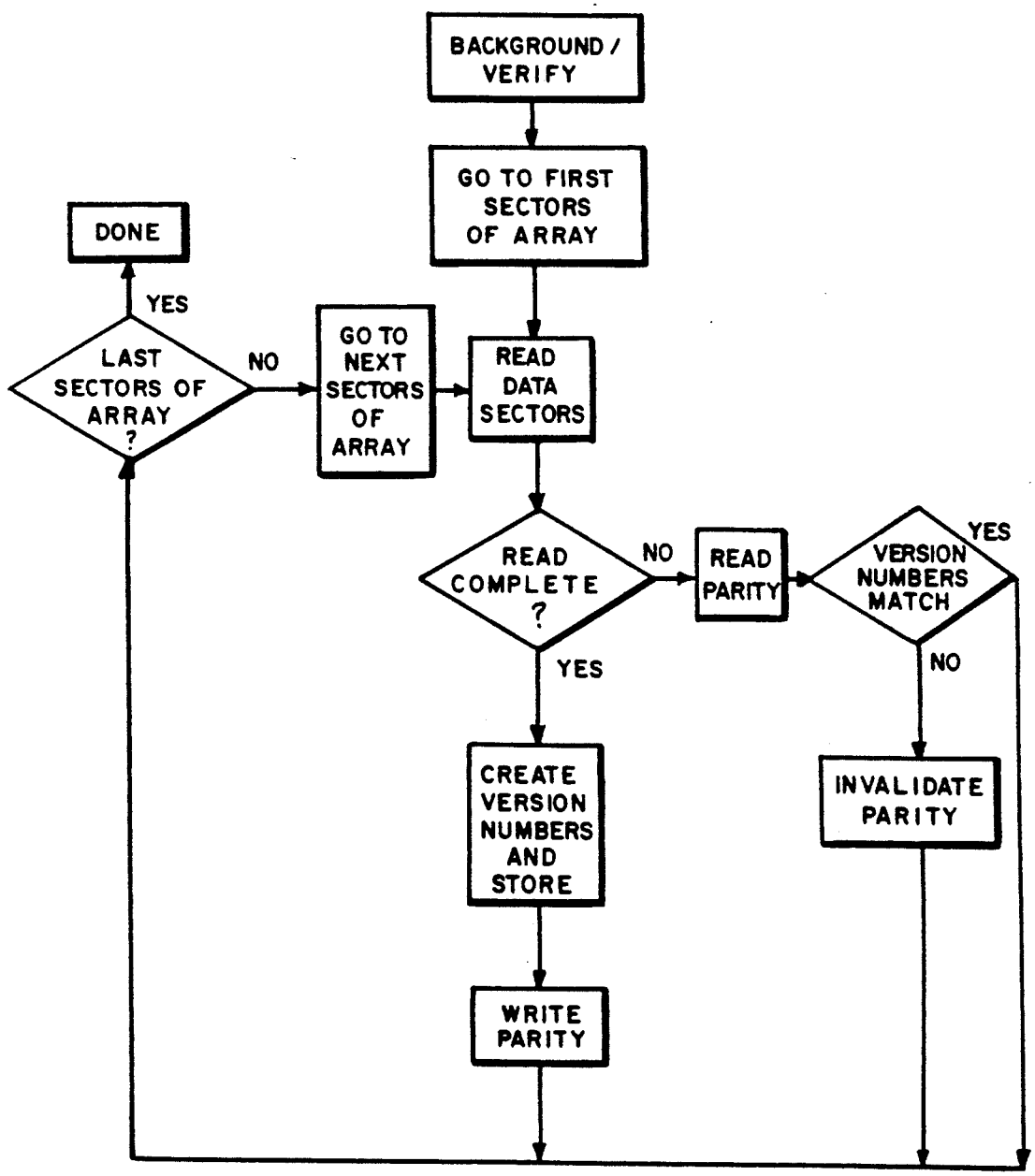
FIG. 10 shows a flow chart for a background/verify operation.

The background/verify process mentioned in FIG. 9 is depicted in FIG. 10. The IOP goes to the first sector of each of the disks of an array and reads the data from all user data sectors thereof. If the reads can be completed, the data is XOR'ed together to form a parity entry. The appropriate version numbers are created and written into the correct regions of the parity sector. The parity entry is entered in the corresponding parity sector. If the corresponding sectors being verified is the final group of corresponding sectors of the array, then the verify process is done. If it is not, then the IOP goes to the next group of corresponding sectors and performs the same operations until the verify process for the array is done.

If in processing each group of corresponding sectors the reads of the data in the user data sectors cannot be completed because the array is operating in a degraded mode, the corresponding parity is read and a check is made to see if the version numbers of the sectors match. If they do not, the parity is invalidated and the IOP either goes to the next group of sectors or, if that is the last sector group, the operation is completed for the array. If there is a match of the version numbers, the parity is not invalidated and the next sector group is processed, or, again if the sector group being processed is the final sector group of the array, the background/verify process is done.

Figure 11:
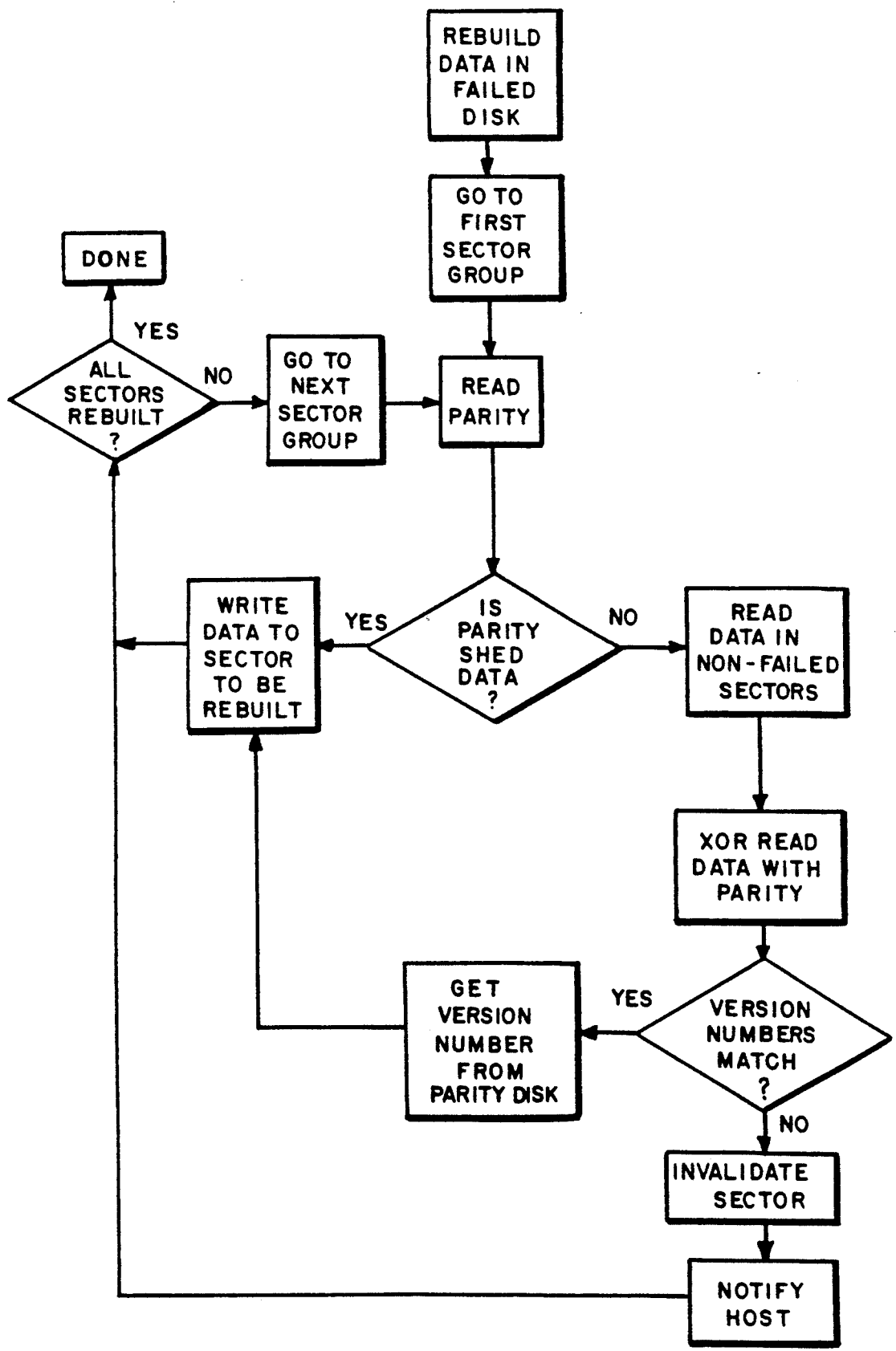
FIG. 11 shows a flow chart for the reconstruction of data in a failed disk.

FIG. 11 depicts an operation for reconstructing, or rebuilding, data in a failed disk. The IOP goes to the first sector group in which a sector of a failed disk is to be reconstructed. The parity entry in that sector group is read and a determination is made as to whether that entry is a true parity entry or is the "shed data" of the failed disk which has been entered to replace the parity entry (i.e., a "parity shedding" operation has occurred). If parity shedding has occurred, the parity entry that is read is the desired reconstructed data and such data is written into the sector of the failed disk. If all sectors of the failed disk have been so rebuilt, the rebuilding process is done. If not, the IOP goes to the next sector group and repeats the process to rebuild the data in the desired sector of the failed disk. The process is repeated until all sectors of the failed disk have been rebuilt.

If, however, the parity entry is not indicated as containing "shed data" but rather is a true parity entry, the data in all non-failed disks of the sector group is read and XOR'ed with the parity entry. If the version numbers in the data disks and the parity disk match, the version number in the parity disk for the sector of the failed disk which is being reconstructed is entered into the failed disk and the reconstructed data is written into the sector of the failed disk. If the version numbers do not match, that sector is identified as an invalid sector and information is sent to the host indicating that the sector is invalid and the data therein cannot be rebuilt.

Thus, the above descriptions disclose the techniques of the invention with reference to the use of a non-volatile RAM, the use of a background/verify operation, and the use of a parity shedding technique for permitting operation in the face of power failures of the types discussed above. Such techniques are not limited to the specific embodiments described above except as defined by the appended claims.

What is claimed is:

1. A method for handling data in a system having a processor for controlling access to a plurality of data storage disks, wherein storage sectors of a selected number of said disks contain user data and storage sectors of a selected one of said disks contain redundant parity entries which match with the user data entries in the sectors corresponding thereto, corresponding user data sectors and parity sectors in said disks forming identifiable sector groups, said method being used when said plurality of disks are being operated in a degraded mode wherein one of said user data disks is inoperative and the user data therein is reconstructed from the user data in the remaining user data disks and the parity entries in the parity disk, said method including the steps wherein before writing new data into a selected sector of an operative disk, writing the reconstructed user data for the corresponding sector of the inoperative disk into the corresponding parity sector of the parity disk to replace the parity entry therein;

entering at a specified identification region of said parity disk, information identifying the inoperative disk whose reconstructed data has been written into the parity disk;

writing the new data into the selected sector of the operative disk.

2. A method in accordance with claim 1 and further including the steps wherein if data cannot be read from a sector of the inoperative disk, reading the information in the specified identification region of the parity disk to determine whether the entry in the corresponding parity sector of the parity disk is the reconstructed data of the inoperative disk; and reading the data in the corresponding parity sector of the parity disk if the information in said identification region identifies the entry in the corresponding parity sector as the reconstructed data for the corresponding data sector of the inoperative disk.

* * * * *